United States Patent
Tada et al.

(10) Patent No.: US 12,398,294 B2
(45) Date of Patent: Aug. 26, 2025

(54) POLISHING COMPOSITION, POLISHING METHOD, AND METHOD OF MANUFACTURING SEMICONDUCTOR SUBSTRATE

(71) Applicant: FUJIMI INCORPORATED, Kiyosu (JP)

(72) Inventors: Masaki Tada, Kiyosu (JP); Akane Kumayama, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 324 days.

(21) Appl. No.: 18/168,448

(22) Filed: Feb. 13, 2023

(65) Prior Publication Data

US 2023/0287243 A1 Sep. 14, 2023

(30) Foreign Application Priority Data

Mar. 8, 2022 (JP) .................. 2022-035214
Sep. 13, 2022 (JP) .................. 2022-145042

(51) Int. Cl.
*C09G 1/02* (2006.01)
*B24B 37/04* (2012.01)
*H01L 21/3105* (2006.01)

(52) U.S. Cl.
CPC .............. *C09G 1/02* (2013.01); *B24B 37/044* (2013.01); *H01L 21/31053* (2013.01)

(58) Field of Classification Search
None
See application file for complete search history.

(56) References Cited

U.S. PATENT DOCUMENTS

| 2009/0078908 A1* | 3/2009 | Saie ........................ C09G 1/02 |
| | | 252/79.1 |
| 2022/0098444 A1* | 3/2022 | Kamimura ............ H01L 21/304 |
| 2023/0135325 A1* | 5/2023 | Liang ....................... C01G 1/00 |
| | | 51/309 |

FOREIGN PATENT DOCUMENTS

JP 2017-139349 A 8/2017

\* cited by examiner

*Primary Examiner* — Roberts P Culbert
(74) *Attorney, Agent, or Firm* — Foley & Lardner LLP

(57) ABSTRACT

To provide means for improving a ratio of a polishing speed of SiOC to a polishing speed of SiN. There is provided a polishing composition containing: abrasive grains containing at least one kind of zirconia particles; a selection ratio improver containing at least one kind of a salt composed of a monovalent anion and a monovalent or higher valent cation and improving a ratio of a polishing speed of SiOC to a polishing speed of SiN; and a pH adjusting agent containing at least one kind of an acid, in which a pH is more than 3.0 and less than 7.0, and a zeta potential of the abrasive grain is a positive value.

9 Claims, No Drawings

POLISHING COMPOSITION, POLISHING METHOD, AND METHOD OF MANUFACTURING SEMICONDUCTOR SUBSTRATE

CROSS-REFERENCE TO RELATED APPLICATIONS

The present application is based on the Japanese Patent Application No. 2022-35214 filed on Mar. 8, 2022, and Japanese Patent Application No. 2022-145042 filed on Sep. 13, 2022, and the entirety of the contents of each disclosure is herein incorporated by reference.

TECHNICAL FIELD

The present invention relates to a polishing composition, a polishing method, and a method of manufacturing a semiconductor substrate.

BACKGROUND ART

In recent years, in accordance with high integration and high performance of large scale integration (LSI), novel microfabrication techniques have been developed. A chemical mechanical polishing (CMP) method is one of them, and it is a technique that is frequently used in an LSI manufacturing process, particularly, in flattening of an interlayer insulating film, formation of a metal plug, and formation of embedded wiring (damascene wiring) in a multilayer wiring forming process.

As a material of the interlayer insulating film in the multilayer wiring forming process, a low dielectric constant (Low-k) material has been adopted to suppress an inter-wire capacitance. Carbon-added silicon oxide in which $SiO_2$ is doped with C (SiOC) (also referred to as carbon-containing silicon oxide) formed by a plasma CVD method is widely used as a low dielectric constant (Low-k) material.

As a technique for polishing SiOC, JP 2017-139349 A discloses a polishing composition containing abrasive grains containing cerium and hydroxyalkyl cellulose and having a pH of 6.0 or more. According to JP 2017-139349 A, with such a configuration, a polishing speed of SiOC can be improved.

SUMMARY OF INVENTION

Recently, a substrate containing both SiOC and SiN (silicon nitride) has been used, and a demand for selectively polishing SiOC in such a substrate has increased. However, the polishing composition described in JP 2017-139349 A has a problem that a ratio (selection ratio) of the polishing speed of SiOC to a polishing speed of SiN may be low.

Therefore, an object of the present invention is to provide means for improving a ratio of a polishing speed of SiOC to a polishing speed of SiN.

The present inventors have conducted intensive studies to solve the above problem. As a result, the present inventors have found that, in a polishing composition containing zirconia particles (abrasive grains), a salt (selection ratio improver) composed of a monovalent anion and a monovalent or higher valent cation, and an acid (pH adjusting agent), the problem is solved by controlling a pH and a zeta potential of the abrasive grain within specific ranges, respectively, thereby completing the present invention.

That is, one aspect of the present invention is a polishing composition containing: abrasive grains containing at least one kind of zirconia particles; a selection ratio improver containing at least one kind of a salt composed of a monovalent anion and a monovalent or higher valent cation and improving a ratio of a polishing speed of SiOC to a polishing speed of SiN; and a pH adjusting agent containing at least one kind of an acid, in which a pH is more than 3.0 and less than 7.0, and a zeta potential of the abrasive grain is a positive value.

DESCRIPTION OF EMBODIMENTS

Hereinafter, embodiments of the present invention will be described. However, the technical scope of the present invention should be determined based on the description of the claims, and is not limited to the following embodiments.

In the present specification, unless otherwise specified, operation and measurement of physical properties and the like are performed under conditions of room temperature (20° C. or higher and 25° C. or lower)/relative humidity of 40% RH or more and 50% RH or less. In addition, in the present specification, a ratio of a polishing speed of SiOC to a polishing speed of SiN is also simply referred to as a "selection ratio", and a selection ratio improver that improves the ratio of the polishing speed of SiOC to the polishing speed of SiN is also simply referred to as a "selection ratio improver". The embodiments described in the present specification can be other embodiments by being arbitrarily combined.

An aspect of the present invention is a polishing composition containing: abrasive grains containing at least one kind of zirconia particles; a selection ratio improver containing at least one kind of a salt composed of a monovalent anion and a monovalent or higher valent cation and improving a ratio of a polishing speed of SiOC to a polishing speed of SiN; and a pH adjusting agent containing at least one kind of an acid, in which a pH is more than 3.0 and less than 7.0, and a zeta potential of the abrasive grain is a positive value. With the configuration, the ratio (selection ratio) of the polishing speed of SiOC to the polishing speed of SiN can be improved.

A mechanism for obtaining the above effect is considered as follows. However, the following mechanism, is merely presumption, and the scope of the present invention is not limited by this mechanism.

The zirconia particles as abrasive grains can polish SiOC at a higher speed than silica particles, ceria particles, and alumina particles.

In the salt composed of a monovalent anion and a monovalent or higher valent cation as a selection ratio improver, the monovalent anion adheres to surfaces of the abrasive grains containing zirconia particles, and the hydrophilicity of the surface is reduced. Therefore, the abrasive grains easily approach the surface of SiOC having a high hydrophobicity, and the polishing speed of SiOC is improved. On the other hand, when a salt composed of a divalent or higher valent anion and a monovalent or higher valent cation is used, the anion adheres to the abrasive grains, so that the zeta potential of the abrasive grain becomes a negative (−) value, and the negatively charged surface of SiOC and the abrasive grains may repel each other. As a result, the polishing speed of SiOC is reduced, and a sufficient selection ratio may not be obtained.

In the acid as a pH adjusting agent, in the same manner as described above, the anion adheres to the surfaces of the abrasive grains containing zirconia particles, and the hydrophilicity of the surface is reduced. Therefore, the abrasive grains easily approach the surface of SiOC having a high hydrophobicity, and the polishing speed of SiOC is improved. In addition, a pH of the polishing composition is controlled to be more than 3.0 and less than 7.0 by the pH adjusting agent. When the pH is within the above range, a sufficient selection ratio improvement effect is obtained. On the other hand, when the pH is 3.0 or less, the surface of SiOC is positively (+) charged and repels abrasive grains having a positive (+) zeta potential, so that the polishing speed of SiOC may be reduced. When the pH is 7.0 or more, the zeta potential of the abrasive grains containing zirconia particles becomes close to zero (0), repulsion between the abrasive grains is reduced, and aggregation may occur (note that an isoelectric point of the zirconia particle is usually a pH of 7.0 to 9.0 (close to 8.0)).

In addition, when the pH is within the range of more than 3.0 and less than 7.0, the abrasive grains containing zirconia particles have a positive (+) zeta potential in the polishing composition, so that the abrasive grains having a positive (+) zeta potential are attracted to the negatively (−) charged surface of SiOC, and the polishing speed of SiOC is improved.

Therefore, the polishing composition according to the present invention is applied to an object to be polished containing SiOC and SiN, so that SiOC can be polished at a high speed. As a result, the ratio of the polishing speed of SiOC to the polishing speed of SiN can be significantly improved.

Hereinafter, the polishing composition according to the present aspect will be described in detail.

[Object to be Polished]

It is preferable that the object to be polished which is polished using the polishing composition of the present aspect contains SiOC (carbon-added silicon oxide) and SiN (silicon nitride).

The object to be polished may further contain other materials in addition to SiOC and SiN. Examples of the other materials include silicon oxide, monocrystalline silicon, polycrystalline silicon (polysilicon), amorphous silicon, polycrystalline silicon doped with n-type or p-type impurities, amorphous silicon doped with n-type or p-type impurities, SiGe, elemental metals (for example, tungsten, copper, cobalt, hafnium, nickel, gold, silver, platinum, palladium, rhodium, ruthenium, iridium, osmium, and the like), metal nitrides (for example, tantalum nitride (TaN), titanium nitride (TiN), and the like), organic materials (for example, amorphous carbon, spin-on carbon (SOC), diamond-like carbon (DLC), nanocrystalline diamond, graphene, and the like), and the like.

A film containing these materials can be formed by a chemical vapor deposition (CVD) method, a physical vapor deposition (PVD) method, a spin coating method, or the like.

[Abrasive Grain]

The polishing composition according to the present aspect contains zirconia particles as abrasive grains. The zirconia particles have an action of mechanically polishing an object to be polished. The zirconia particles may be used alone or in combination of two or more kinds thereof. In addition, as the zirconia particles, a commercially available product may be used, or a synthetic product may be used. Note that, in general, zirconia contains hafnia ($HfO_2$), which is an inevitable impurity. In the present specification, a numerical value related to the composition such as a content or the like is a numerical value calculated by regarding hafnia ($HfO_2$), which is an inevitable impurity, as zirconia ($ZrO_2$).

The zirconia particles are preferably colloidal zirconia particles or pulverized/calcined calcined zirconia particles, and more preferably colloidal zirconia particles. In addition, the zirconia particles may be undoped or doped with, for example, yttrium (Y) or an oxide thereof, calcium oxide, or magnesium oxide. Note that a crystal structure of the zirconia particles is not particularly limited, and may be any of a monoclinic crystal, a tetragonal crystal, and a cubic crystal.

A shape of the zirconia particle is not particularly limited, and may be a spherical shape or a non-spherical shape. Specific examples of the non-spherical shape include various shapes such as a polygonal prism shape such as a triangular prism, a tetragonal prism, or the like, a cylindrical shape, a straw bag shape in which a central portion of a cylinder is inflated compared to ends, a doughnut shape in which a central portion of a disk is perforated, a plate shape, a so-called cocoon-like shape having a constriction in a middle portion, a so-called associated type spherical shape in which a plurality of particles are integrated, a so-called konpeito shape having a plurality of protrusions on a surface, a rod shape, a diamond shape, a square shape, a rugby ball shape, and the like, but are not limited thereto.

The zirconia particles are an aggregate containing primary particles and/or secondary particles. An aggregate can be formed of a combination of individual particles, which are known in the art as primary particles, while aggregated combinations of particles are known in the art as secondary particles. The zirconia particles in the polishing composition can be in a form of primary particles or in a form of secondary particles that are an aggregate of primary particles. Alternatively, the zirconia particles can be present both in a form of primary particles and in a form of secondary particles. In a preferred embodiment, the zirconia particles are present at least partially in a form of secondary particles in the polishing composition.

A particle size of the zirconia particle according to the present aspect is preferably 5 nm or more and 200 nm or less, more preferably 10 nm or more and 150 nm or less, still more preferably 30 nm or more and 100 nm or less, and particularly preferably 50 nm or more and 90 nm or less. When the particle size of the zirconia particle is 5 nm or more, polishing becomes efficient, and a sufficient polishing speed is obtained. When the particle size of the zirconia particle is 200 nm or less, the dispersion stability of the polishing composition is excellent. Note that, in the present specification, the particle size of the zirconia particle refers to a diameter of a particle (D50, hereinafter, also simply referred to as "D50") when an integrated particle volume reaches 50% of a total particle volume from a fine particle side in a particle size distribution determined by a laser diffraction scattering method. As D50 of the zirconia particles in the present specification, a value measured by the method described in Examples is adopted.

In the present aspect, one of the features of the abrasive grains (preferably the zirconia particles) in the polishing composition is that the abrasive grains have a positive zeta potential. Due to this, the abrasive grains having a positive (+) zeta potential are attracted to the negatively (−) charged surface of SiOC, and the polishing speed of SiOC is improved. A zeta potential of the abrasive grain (preferably the zirconia particle) in the polishing composition is preferably more than 0 mV and +70 mV or less, more preferably +10 mV or more and +60 mV or less, still more preferably +20 mV or more and +50 mV or less, and particularly preferably +30 mV or more and +45 mV or less. When the zeta potential of the abrasive grain (preferably the zirconia particle) in the polishing composition is +10 mV or more, a force by which the abrasive grains (preferably the zirconia particles) are attracted to the negatively (−) charged surface of SiOC is increased, so that the polishing becomes more efficient. When the zeta potential of the abrasive grain (preferably the zirconia particle) in the polishing composition is +70 mV or less, removal of the abrasive grains by cleaning after polishing is facilitated. The zeta potential of the abrasive grain in the polishing composition can be controlled by a type or amount of the pH adjusting agent or the selection ratio improver of the polishing composition. Note that as the zeta potential of the abrasive grain in the present specification, a value measured by the method described in Examples is adopted.

A content (concentration) of the abrasive grains (preferably the zirconia particles) in the polishing composition is not particularly limited. In a case of a polishing composition that is used for polishing an object to be polished as a polishing solution as it is (it is typically a slurry-like polishing solution, and may be also referred to as a working slurry or a polishing slurry), a content of abrasive grains is preferably 0.01% by mass or more and 10.0% by mass or less, more preferably 0.01% by mass or more and 5.0% by mass or less, still more preferably 0.01% by mass or more and 1.0% by mass or less, still much more preferably 0.05% by mass or more and 1.0% by mass or less, particularly preferably 0.06% by mass or more and 0.50% by mass or less, and most preferably 0.07% by mass or more and 0.30% by mass or less, with respect to the total mass of the polishing composition. When the content of the abrasive grains is within the above range, a sufficient polishing speed for SiOC is obtained, and a polishing composition excellent in cost is obtained.

In addition, in a case of a polishing composition (that is, a concentrated solution or an undiluted solution of a working slurry) that is diluted and used for polishing, from the viewpoint of storage stability, filterability, and the like, usually, a content of abrasive grains is suitably 30% by mass or less, and preferably 25% by mass or less. In addition, from the viewpoint of taking advantage of the concentrated solution, the content of the abrasive grains in the case of the polishing composition that is diluted and used for polishing is preferably 0.3% by mass or more, and more preferably 0.5% by mass or more.

Note that, in a case where the polishing composition contains two or more kinds of abrasive grains, a content of the abrasive grains is intended to be a total amount thereof.

The polishing composition according to the present aspect may further contain other abrasive grains addition to the zirconia particles within a range in which the effects of the present invention are not impaired. The other abrasive grains may be any of inorganic particles, organic particles, and organic-inorganic composite particles. Specific examples of the inorganic particles include particles formed of a metal oxide such as unmodified silica, cation-modified silica, alumina, ceria, titania, or the like, silicon nitride particles, silicon carbide particles, boron nitride particles, and the like. Specific examples of the organic particles include polymethylmethacrylate (PMMA) particles. The other abrasive grains may be used alone or in combination of two or more kinds thereof. In addition, as the other abrasive grains, a commercially available product may be used, or a synthetic product may be used.

However, a content of the other abrasive grains is preferably 20% by mass or less, more preferably 10% by mass or less, still more preferably 5% by mass or less, and particularly preferably 1% by mass or less, with respect to the total mass of the abrasive grains. Most preferably, the content of the other abrasive grains is 0% by mass, that is, the abrasive grains are composed solely of zirconia particles.

[Selection Ratio Improver]

The polishing composition of the present aspect contains a selection ratio improver that improves a ratio of a polishing speed of SiOC to a polishing speed of SiN. The selection ratio improver contains at least one kind of a salt composed of a monovalent anion and a monovalent or higher valent cation. The salts may be used alone or in combination of two or more kinds thereof.

The anion constituting the salt is required to be monovalent. When a divalent or higher valent anion is used, the anion may adhere to the abrasive grains, and the zeta potential of the abrasive grain may be a negative (−) value. As a result, the polishing speed of SiOC is reduced, and a sufficient selection ratio may not be obtained. Examples of the monovalent anion include halide ions such as a fluoride ion, chloride ion, bromide ion, iodide ion, and the like, nitrate ion, acetate ion, formate ion, propionate ion, butyrate ion, valerate ion, 2-methylbutyrate ion, n-hexanoate ion, 3,3-dimethylbutyrate ion, 2-ethylbutyrate ion, 4-methylpentanoate ion, n-heptanoate ion, 2-methylhexanoate ion, n-octanoate ion, 2-ethylhexanoate ion, benzoate ion, glycolate ion, salicylate ion, glycerate ion, lactate ion, 2-furancarboxylate ion, 3-furancarboxylate ion, 2-tetrahydrofurancarboxylate ion, methoxyacetate ion, methoxyphenylacetate ion, phenoxyacetate ion, methanesulfonate ion, ethanesulfonate ion, isethionate ion, and the like. Among them, from the viewpoint of further improving the selection ratio, nitrate ion and acetate ion are preferable, and acetate ion is more preferable.

A valence of the cation constituting the salt is not particularly limited, and monovalent, divalent, trivalent, and the like are not particularly limited. Examples of the monovalent or higher valent cation include sodium ion, potassium ion, lithium ion, calcium ion, magnesium ion, ammonium ion, and the like. Among them, from the viewpoint of further improving the selection ratio, sodium ion, potassium ion, and ammonium ion are preferable, and ammonium ion is more preferable.

Specific examples of the salt include ammonium acetate, sodium acetate, potassium acetate, lithium acetate, magnesium acetate, calcium acetate, ammonium nitrate, sodium nitrate, potassium nitrate, lithium nitrate, magnesium nitrate, calcium nitrate, ammonium fluoride, sodium fluoride, potassium fluoride, lithium fluoride, magnesium fluoride, calcium fluoride, ammonium chloride, sodium chloride, potassium chloride, lithium chloride, magnesium chloride, calcium chloride, ammonium bromide, sodium bromide, potassium bromide, lithium bromide, magnesium bromide, calcium bromide, ammonium iodide, sodium iodide, potassium iodide, lithium iodide, magnesium iodide, calcium iodide, and the like. Among them, from the viewpoint of further improving the selection ratio, ammonium acetate, sodium acetate, potassium acetate, and ammonium nitrate are preferable, ammonium acetate, sodium acetate, and potassium acetate are more preferable, and ammonium acetate is still more preferable. That is, according to a preferred embodiment of the present invention, the selection ratio improver contains ammonium acetate. According to a more preferred embodiment of the present invention, the selection ratio improver is composed solely of ammonium acetate.

A content (concentration) of the selection ratio improver (preferably ammonium acetate) in the polishing composition is not particularly limited. In a case of a polishing composition that is used for polishing an object to be polished as a polishing solution as it is (it is typically a slurry-like polishing solution, and may be also referred to as a working slurry or a polishing slurry), the content (concentration) of the selection ratio improver is preferably 30 ppm or more and 2,000 ppm or less, more preferably 50 ppm or more and 1,000 ppm or less, still more preferably 75 ppm or more and 750 ppm or less, particularly preferably 100 ppm or more and 700 ppm or less, and most preferably 300 ppm or more and 600 ppm or less, with respect to the total mass of the polishing composition, from the viewpoint of improving the selection ratio. When the content of the selection ratio improver is within the above range, the selection ratio can be further improved. Note that, in the present specification, "ppm" means "ppm by mass".

In addition, from the viewpoint of further improving the stability of the polishing composition, the content (concentration) of the selection ratio improver (preferably ammonium acetate) is preferably 50 ppm or more and 500 ppm or less, and more preferably 50 ppm or more and 200 ppm or less, with respect to the total mass of the polishing composition.

In addition, in a case of a polishing composition (that is, a concentrated solution or an undiluted solution of a working slurry) that is diluted and used for polishing, from the viewpoint of storage stability, filterability, and the like, usually, a content (concentration) of a selection ratio improver (preferably ammonium acetate) is suitably 3% by mass (30,000 ppm) or less, and preferably 2% by mass (20,000 ppm) or less. In addition, from the viewpoint of taking advantage of the concentrated solution, the content of the selection ratio improver in the case of the polishing composition that is diluted and used for polishing is preferably 100 ppm or more, and more preferably 500 ppm or more.

Note that, in a case where the polishing composition contains two or more kinds of selection ratio improvers, a content of the selection ratio improvers is intended to be a total amount thereof.

In addition, a ratio (mass ratio) of the amount of selection ratio improver to the amount of abrasive grains (amount of selection ratio improver/amount of abrasive grains) is preferably 0.01 or more and 5 or less, more preferably 0.05 or more and 1 or less, still more preferably 0.1 or more and 0.8 or less, and particularly preferably 0.3 or more and 0.7 or less. When the ratio of the amount of selection ratio improver to the amount of abrasive grains is within the above range, the selection ratio can be further improved.

The polishing composition according to the present aspect may further contain, as the selection ratio improver, other materials in addition to the salt composed of a monovalent anion and a monovalent or higher valent cation, which has a function of improving the selection ratio, as long as the effects of the present invention are not impaired. However, a content of the other materials is preferably 20% by mass or less, more preferably 10% by mass or less, still more preferably 5% by mass or less, and particularly preferably 1% by mass or less, with respect to the total mass of the selection ratio improver. Most preferably, the content of the other materials is 0% by mass, that is, the selection ratio improver is in a form consisted of a salt composed of a monovalent anion and a monovalent or higher valent cation.

[Dispersing Medium]

It is preferable that the polishing composition of the present aspect contains a dispersing medium for dispersing the respective components. As the dispersing medium, water; alcohols such as methanol, ethanol, ethylene glycol, and the like; ketones such as acetone and the like, and a mixture thereof can be exemplified. Among them, water is preferable as the dispersing medium. That is, according to a preferred embodiment of the present invention, the dispersing medium contains water. According to a more preferred embodiment of the present invention, the dispersing medium is substantially composed of water. Note that the term "substantially" is intended to mean that a dispersing medium other than water can be contained as long as the effects of the object of the present invention can be achieved, and more specifically, the dispersing medium is preferably 90% by mass or more and 100% by mass or less of water and 0% by mass or more and 10% by mass or less of a dispersing medium other than water, and more preferably 99% by mass or more and 100% by mass or less of water and 0% by mass or more and 1% by mass or less of a dispersing medium other than water. Most preferably, the dispersing medium is water.

From the viewpoint of preventing the action of the components contained in the polishing composition from being inhibited, as the dispersing medium, water containing as few impurities as possible is preferably, and specifically, pure water or ultrapure water, or distilled water obtained by removing foreign matters through a filter after removing impurity ions with an ion exchange resin is more preferable.

[pH and pH Adjusting Agent]

A pH of the polishing composition according to the present aspect is more than 3.0 and less than 7.0. When the pH is 3.0 or less, as described above, the polishing speed of SiOC is reduced, and a desired selection ratio may not be obtained. When the pH is 7.0 or more, the aggregation of the abrasive grains may occur as described above.

The pH of the polishing composition is preferably 3.5 or more and 6.5 or less, more preferably 4.0 or more and 6.0 or less, and still more preferably 4.5 or more and 5.5 or less, from the viewpoint of improving the selection ratio. Note that the pH of the polishing composition can be measured by a pH meter. As the pH in the present specification, a value measured by the method described in Examples is adopted.

The polishing composition according to the present aspect contains a pH adjusting agent. The pH adjusting agent contains at least one kind of an acid. The acid may be either an inorganic acid or an organic acid. The acids may be used alone or in combination of two or more kinds thereof.

Specific examples of the inorganic acid include hydrochloric acid, hydrofluoric acid, nitric acid, and the like. Specific examples of the organic acid include formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, lactic acid, 2-furancarboxylic acid, 3-furancarboxylic acid, 2-tetrahydrofurancarboxylic acid, methoxyacetic acid, methoxyphenylacetic acid, phenoxyacetic acid, methanesulfonic acid, ethanesulfonic acid, isethionic acid, and the like. Among them, from the viewpoint of further improving the selection ratio, nitric acid and acetic acid are preferable, and acetic acid is more preferable. That is, according to a preferred embodiment of the present invention, the pH adjusting agent contains acetic acid. According to a more preferred embodiment of the present invention, the pH adjusting agent is composed solely of acetic acid.

The amount of pH adjusting agent added is not particularly limited, and may be adequately adjusted so that the polishing composition has a desired pH.

Note that a base may be used as the pH adjusting agent as necessary, but according to a preferred embodiment of the present invention, the pH adjusting agent is composed of only at least one kind of an acid.

[Additives]

The polishing composition according to the present aspect may further contain known additives that can be used for the polishing composition, such as a dispersant, an oxidizing agent, a complexing agent, an antiseptic agent, an antifungal agent, and the like, as long as the effects of the present invention are not impaired. Since the polishing composition according to the present aspect is acidic, it is preferable that the polishing composition contains an antifungal agent. In addition, from the viewpoint of improving the dispersion stability of the abrasive grains (in particular, zirconia particles), it is also a preferred embodiment to contain a dispersant. That is, in a preferred embodiment of the present invention, a polishing composition contains: abrasive grains containing at least one kind of zirconia particles; a selection ratio improver containing at least one kind of a salt composed of a monovalent anion and a monovalent or higher valent cation and improving a ratio of a polishing speed of SiOC to a polishing speed of SiN; a pH adjusting agent containing at least one kind of an acid; a dispersing medium; and at least one selected from the group consisting of an antifungal agent and a dispersant. In a more preferred embodiment of the present invention, a polishing composition is substantially composed of: abrasive grains containing at least one kind of zirconia particles; a selection ratio improver containing at least one kind of a salt composed of a monovalent anion and a monovalent or higher valent cation and improving a ratio of a polishing speed of SiOC to a polishing speed of SiN; a pH adjusting agent containing at least one kind of an acid; a dispersing medium; and at least one selected from the group consisting of an antifungal agent and a dispersant. Here, "the polishing composition is substantially composed of: abrasive grains containing at least one kind of zirconia particles; a selection ratio improver containing at least one kind of a salt composed of a monovalent anion and a monovalent or higher valent cation and improving a ratio of a polishing speed of SiOC to a polishing speed of SiN; a pH adjusting agent containing at least one kind of an acid; a dispersing medium; and at least one selected from the group consisting of an antifungal agent and a dispersant" is intended that a total content of abrasive grains, a selection ratio improver, a pH adjusting agent, a dispersing medium, and an antifungal agent and/or a dispersant exceeds 99% by mass (upper limit: 100% by mass) with respect to the polishing composition. Preferably, the polishing composition is composed of abrasive grains, a selection ratio improver, a pH adjusting agent, a dispersing medium, and an antifungal agent and/or a dispersant (the total content=100% by mass).

The antifungal agent (antiseptic agent) is not particularly limited, and can be appropriately selected according to a desired application and purpose. Specific examples thereof include isothiazoline antiseptic agents such as 1,2-benzisothiazol-3(2H)-one (BIT), 2-methyl-4-isothiazolin-3-one, 5-chloro-2-methyl-4-isothiazolin-3-one, and the like, phenoxyethanol, and the like.

Alternatively, the antifungal agent (antiseptic agent) may be a compound represented by the following Chemical Formula 1.

[Chem. 1]

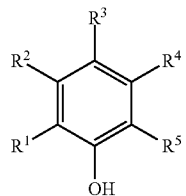

(Chemical Formula 1)

In Chemical Formula 1, R1 to R5 are each independently a hydrogen atom or a substituent consisting of at least two atoms selected from the group consisting of carbon atom, hydrogen atom, and oxygen atom.

Examples of the substituent consisting of at least two atoms selected from the group consisting of carbon atom, hydrogen atom, and oxygen atom include hydroxy group, carboxy group, an alkyl group having 1 or more and 20 or fewer carbon atom(s), a hydroxyalkyl group having 1 or more and 20 or fewer carbon atom(s), an alkoxy group having 1 or more and 20 or fewer carbon atom(s), a hydroxyalkoxy group having 1 or more and 20 or fewer carbon atom(s), an alkoxycarbonyl group having 2 or more and 21 or fewer carbon atoms, an aryl group having 6 or more and 30 or fewer carbon atoms, an aralkyl group (arylalkyl group) having 7 or more and 31 or fewer carbon atoms, an aryloxy group having 6 or more and 30 or fewer carbon atoms, an aryloxycarbonyl group having 7 or more and 31 or fewer carbon atoms, an aralkyloxycarbonyl group having 8 or more and 32 or fewer carbon atoms, an acyl group having 1 or more and 20 or fewer carbon atom(s), an acyloxy group having 1 or more and 20 or fewer carbon atom(s), and the like.

More specific examples of the alkyl group having 1 or more and 20 or fewer carbon atom(s) include linear alkyl groups such as methyl group, ethyl group, n-propyl group, n-butyl group, n-pentyl group, n-hexyl group, n-heptyl group, n-octyl group, n-nonyl group, n-decyl group, and the like; branched alkyl groups such as isopropyl group, isobutyl group, s-butyl group, t-butyl group, t-amyl group, neopentyl group, 3-methylpentyl group, 1,1-diethylpropyl group, 1,1-dimethylbutyl group, 1-methyl-1-propylbutyl group, 1,1-dipropylbutyl group, 1,1-dimethyl-2-methylpropyl group, 1-methyl-1-isopropyl-2-methylpropyl group, and the like; cyclic alkyl groups such as cyclobutyl group, cyclopentyl group, cyclohexyl group, cycloheptyl group, cyclooctyl group, norbornenyl group, and the like; and the like.

Examples of the hydroxyalkyl group having 1 or more and 20 or fewer carbon atom(s) include hydroxymethyl group, 2-hydroxyethyl group, 2-hydroxy-n-propyl group, 3-hydroxy-n-propyl group, 2-hydroxy-n-butyl group, 3-hydroxy-n-butyl group, 4-hydroxy-n-butyl group, 2-hydroxy-n-pentyl group, 3-hydroxy-n-pentyl group, 4-hydroxy-n-pentyl group, 5-hydroxy-n-pentyl group, 2-hydroxy-n-hexyl group, 3-hydroxy-n-hexyl group, 4-hydroxy-n-hexyl group, 5-hydroxy-n-hexyl group, 6-hydroxy-n-hexyl group, and the like.

Examples of the alkoxy group having 1 or more and 20 or fewer carbon atom(s) include linear alkoxy groups such as methoxy group, ethoxy group, n-propyloxy group, n-butyloxy group, n-pentyloxy group, n-hexyloxy group, n-heptyloxy group, n-octyloxy group, n-nonyloxy group, n-decyloxy group, and the like; branched alkoxy groups such as isopropyloxy group, isobutyloxy group, s-butyloxy group, t-butyloxy group, t-amyloxy group, neopentyloxy group, 3-methylpentyloxy group, 1,1-diethylpropyloxy group, 1,1-dimethylbutyloxy group, 1-methyl-1-propylbutyloxy group, 1,1-dipropylbutyloxy group, 1,1-dimethyl-2-methylpropyloxy group, 1-methyl-1-isopropyl-2-methylpropyloxy group, and the like; cyclic alkoxy groups such as cyclobutyloxy group, cyclopentyloxy group, cyclohexyloxy group, cycloheptyloxy group, cyclooctyloxy group, a norbornenyloxy group, and the like; and the like.

Examples of the hydroxyalkoxy group having 1 or more and 20 or fewer carbon atom(s) include hydroxymethoxy group, 2-hydroxyethoxy group, 2-hydroxy-n-propyloxy group, 3-hydroxy-n-propyloxy group, 2-hydroxy-n-butyloxy group, 3-hydroxy-n-butyloxy group, 4-hydroxy-n-butyloxy group, 2-hydroxy-n-pentyloxy group, 3-hydroxy-n-pentyloxy group, 4-hydroxy-n-pentyloxy group, 5-hydroxy-n-pentyloxy group, 2-hydroxy-n-hexyloxy group, 3-hydroxy-n-hexyloxy group, 4-hydroxy-n-hexyloxy group, 5-hydroxy-n-hexyloxy group, 6-hydroxy-n-hexyloxy group, and the like.

Examples of the alkoxycarbonyl group having 2 or more and 21 or fewer carbon atoms include methoxycarbonyl group, ethoxycarbonyl group, a propoxycarbonyl group, a butoxycarbonyl group, a pentyloxycarbonyl group, a hexyloxycarbonyl group, an octyloxycarbonyl group, a decyloxycarbonyl group, and the like.

Examples of the aryl group having 6 or more and 30 or fewer carbon atoms include phenyl group, a naphthyl group, an anthranil group, a pyrenyl group, and the like.

Examples of the aralkyl group (arylalkyl group) having 7 or more and 31 or fewer carbon atoms include benzyl group, phenethyl group (phenylethyl group), and the like, and examples of the aryloxy group having 6 or more and 30 or fewer carbon atoms include phenyloxy group (phenoxy group), a naphthyloxy group, an anthranyloxy group, a pyrenyloxy group, and the like.

Examples of the aryloxycarbonyl group having 7 or more and 31 or fewer carbon atoms include phenyloxycarbonyl group, a naphthyloxycarbonyl group, an anthranyloxycarbonyl group, a pyrenyloxycarbonyl group, and the like.

Examples of the aralkyloxycarbonyl group having 8 or more and 32 or fewer carbon atoms include benzyloxycarbonyl group, phenethyloxycarbonyl group, and the like.

Examples of the acyl group having 1 or more and 20 or fewer carbon atom(s) include methanoyl group (formyl group), ethanoyl group (acetyl group), propanoyl group, a butanoyl group, a pentanoyl group, a hexanoyl group, an octanoyl group, a decanoyl group, a benzoyl group, and the like.

Examples of the acyloxy group having 1 or more and 20 or fewer carbon atom(s) include a formyloxy group, acetyloxy group, propanoyloxy group, a butanoyloxy group, a pentanoyloxy group, a hexanoyloxy group, an octanoyloxy group, a decanoyloxy group, a benzoyloxy group, and the like.

Furthermore, the antifungal agent represented by Chemical Formula 1 is preferably at least one selected from the group consisting of compounds represented by the following Chemical Formulas 1-a to 1-c.

[Chem. 2]

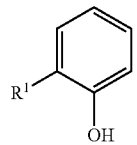

(Chemical Formula 1-a)

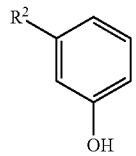

(Chemical Formula 1-b)

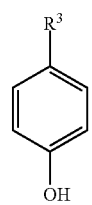

(Chemical Formula 1-c)

In Chemical Formula 1, R1 to R3 are each independently a substituent consisting of at least two atoms selected from the group consisting of carbon atom, hydrogen atom, and oxygen atom.

Since examples of the substituent consisting of at least two atoms selected from the group consisting of carbon atom, hydrogen atom, and oxygen atom are the same as those described above, the description thereof will be omitted here.

More specific examples of the compound represented by Chemical Formula 1 include p-oxy-benzoic acid esters (p-hydroxybenzoic acid esters) such as methyl p-oxy-benzoate (methyl p-hydroxybenzoate), ethyl p-oxy-benzoate (ethyl p-hydroxybenzoate), butyl p-oxy-benzoate (butyl p-hydroxybenzoate), benzyl p-oxy-benzoate (benzyl p-hydroxybenzoate), and the like; salicylic acid, methyl salicylate, phenol, catechol, resorcinol, hydroquinone, isopropylphenol, cresol, thymol, phenoxyethanol, phenylphenol (2-phenylphenol, 3-phenylphenol, or 4-phenylphenol), 2-phenylethyl alcohol (phenethyl alcohol), and the like. Among them, from the viewpoint of more effectively exhibiting desired effects of the present invention, the compound represented by Chemical Formula 1 is preferably at least one selected from the group consisting of ethyl p-oxy-benzoate, butyl p-oxy-benzoate, and phenylphenol, and more preferably butyl p-oxy-benzoate.

Alternatively, the antifungal agent (antiseptic agent) may be an unsaturated fatty acid. Examples of the unsaturated fatty acid include monounsaturated fatty acids such as crotonic acid, myristoleic acid, palmitoleic acid, oleic acid, ricinoleic acid, and the like; diunsaturated fatty acids such as sorbic acid, linoleic acid, eicosadienoic acid, and the like; triunsaturated fatty acids such as linolenic acid, pinolenic acid, eleostearic acid, and the like; tetraunsaturated fatty acids such as stearidonic acid, arachidonic acid, and the like; pentaunsaturated fatty acids such as bosseopentaenoic acid, eicosapentaenoic acid, and the like; hexaunsaturated fatty acids such as docosahexaenoic acid, nisinic acid, and the like; and the like. Among them, from the viewpoint of more effectively exhibiting desired effects of the present invention, the unsaturated fatty acid is preferably sorbic acid.

In addition to the above, compounds of 1,2-alkanediols such as 1,2-pentanediol, 1,2-hexanediol, 1,2-octanediol, and the like; alkyl glyceryl ethers such as 2-ethylhexyl glyceryl ether (ethylhexylglycerin) and the like; and capric acid, dehydroacetic acid, and the like may be used as the antifungal agent (antiseptic agent).

The antifungal agents (antiseptic agents) may be used alone or in combination of two or more kinds thereof.

In a case where the polishing composition contains an antifungal agent (antiseptic agent), a content (concentration) of the antifungal agent (antiseptic agent) in the polishing composition is not particularly limited. For example, in a case of a polishing composition used for polishing an object to be polished as a polishing solution as it is (it is typically a slurry-like polishing solution, and may be also referred to as a working slurry or a polishing slurry), a lower limit of the content (concentration) of the antifungal agent (antiseptic agent) in the polishing composition is preferably 0.0001% by mass or more, more preferably 0.001% by mass or more, and still more preferably 0.01% by mass or more. In addition, an upper limit of the content (concentration) of the antifungal agent (antiseptic agent) is preferably 3% by mass or less, and more preferably less than 1% by mass. That is, the content (concentration) of the antifungal agent (antiseptic agent) in the polishing composition is preferably 0.0001% by mass or more and 3% by mass or less, more preferably 0.001% by mass or more and 3% by mass or less, and still more preferably 0.01% by mass or more and less than 1% by mass. Within such a range, an effect sufficient to inactive or destroy microorganisms is obtained.

In addition, in a case of a polishing composition (that is, a concentrated solution or an undiluted solution of a working slurry) that is diluted and used for polishing, from the viewpoint of improving the polishing speed, usually, the content of the antifungal agent (antiseptic agent) is suitably 10% by mass or less, and more preferably 5% by mass or less. In addition, from the viewpoint of performing a treatment on the polishing composition after polishing, that is, reducing a burden of a waste water treatment, or the like, the content of the antifungal agent (antiseptic agent) is preferably 0.03% by mass or more, and more preferably 0.3% by mass or more.

Note that, in a case where the polishing composition contains two kinds or more of antifungal agents (antiseptic agents), the content is intended to be a total amount thereof.

The dispersant is not particularly limited, and can be appropriately selected according to a desired application and purpose. From the viewpoint of the dispersibility (in particular, the dispersibility of zirconia particles) after storage, it is preferable to use a sugar alcohol. The surface of the zirconia particle (abrasive grain) is usually hydrophobic, and the abrasive grains are easily aggregated with each other. In addition, the polishing composition according to the present invention contains at least one kind of a salt composed of a monovalent anion and a monovalent or higher valent cation as a selection ratio improver, so that the electrical conductivity (EC) is improved and the electrostatic repulsion between the zirconia particles (abrasive grains) is reduced. Therefore, the abrasive grains are more likely to be aggregated. When a sugar alcohol is mixed with the zirconia particles (abrasive grains), a hydrophobic group (hydrocarbon group) of the sugar alcohol adheres to the hydrophobic surface of the zirconia particle, and a hydroxyl group of the sugar alcohol is oriented to the outside of the zirconia particles, so that the surface of the zirconia particle is hydrophilized. By this hydrophilization, the zirconia particles are easily mixed with a dispersing medium (in particular, water), and can be separately present as particles. In addition, the sugar alcohol adheres to the surface of the abrasive grain, so that steric hindrance occurs, and aggregation of the abrasive grains can be suppressed. Note that the mechanism of improving the dispersibility of the zirconia particles is a presumption, and the present invention is not limited to the presumption.

That is, in an aspect of the present invention, the polishing composition further contains at least one kind of a dispersant selected from the group consisting of sugar alcohols.

The sugar alcohol is not particularly limited, and preferably has three or more hydroxy groups in the molecule. Specific examples thereof include pentaerythritol, dipentaerythritol, sorbitan, adonitol, maltitol, threitol, erythritol, arabinitol, ribitol, xylitol, iditol, sorbitol, mannitol, lactitol, galactitol, dulcitol, talitol, allitol, perseitol, volemitol, D-erythro-L-galaoctitol, D-erythro-L-talooctitol, erythromannooctitol, D-threo-L-galaoctitol, D-arabo-D-mannononitol, D-gluco-D-galladecitol, bornesitol, conduritol, inositol, ononitol, pinitol, pinpolitol, quebrachitol, valenol, viscumitol, and the like. Among them, a sugar alcohol having a linear structure is more preferable. Specifically, xylitol, sorbitol, adonitol, threitol, erythritol, arabinitol, ribitol, iditol, mannitol, galactitol, talitol, allitol, and perseitol are preferable, xylitol and sorbitol are more preferable, and sorbitol is still more preferable. These sugar alcohols can be used alone or in a combination of two or more thereof.

A molecular weight of the sugar alcohol is not particularly limited, and is preferably 80 or more, more preferably 100 or more, and still more preferably 120 or more. In addition, the molecular weight of the sugar alcohol is not particularly limited, and is preferably less than 1,000, more preferably 600 or less, still more preferably 400 or less, and particularly preferably 200 or less. That is, the molecular weight of the sugar alcohol is preferably 80 or more and less than 1,000, more preferably 100 or more and 600 or less, still more preferably 120 or more and 400 or less, and particularly preferably 120 or more and 200 or less.

In a case where the polishing composition of the present invention further contains a dispersant (in particular, a sugar alcohol), a content (concentration) of the dispersant (in particular, the sugar alcohol) is not particularly limited, and can be appropriately selected according to a desired application and purpose. For example, in the working slurry (polishing slurry), the content (concentration) of the dispersant (in particular, the sugar alcohol) in the polishing composition is, for example, 10 ppm or more, preferably 50 ppm or more, more preferably 80 ppm or more, and still more preferably 90 ppm or more, with respect to the total mass of the polishing composition. In addition, an upper limit of the content (concentration) of the dispersant (in particular, the sugar alcohol) in the polishing composition is, for example, 500 ppm or less, preferably 300 ppm or less, more preferably 200 ppm or less, and still more preferably less than 200 ppm, with respect to the total mass of the polishing composition. That is, the content (concentration) of the dispersant (in particular, the sugar alcohol) in the polishing composition is, for example, 10 ppm or more and 500 ppm or less, preferably 50 ppm or more and 500 ppm or less, more preferably 80 ppm or more and 500 ppm or less, still more preferably 90 ppm or more and 300 ppm or less, particularly preferably 90 ppm or more and 200 ppm or less, and most preferably 90 ppm or more and less than 200 ppm, with respect to the total mass of the polishing composition. When the content of the dispersant is within the above range, excellent dispersibility can be maintained even after the abrasive grains (in particular, the zirconia particles) are stored for a long period of time.

The polishing composition according to the present aspect may be a one-pack type or a multi-pack type including a two-pack type. In addition, the polishing composition according to the present aspect may be prepared by diluting an undiluted solution of the polishing composition by, for example, 2 to 100 times, preferably 2 to 50 times, and more preferably 3 to 10 times, on a volume basis, using a diluent such as water.

[Method of Producing Polishing Composition]

A method of producing a polishing composition according to the present aspect is not particularly limited, and for example, the polishing composition can be obtained by stirring and mixing abrasive grains, a selection ratio improver, a pH adjusting agent, and as necessary, additives, in a dispersing medium (in particular, in water). Details of the respective components are as described above.

A temperature when the respective components are mixed is not particularly limited, and is preferably 10° C. or higher and 40° C. or lower, and heating may be performed to increase a rate of dissolution. In addition, a mixing time is also not particularly limited as long as uniform mixing can be achieved.

[Polishing Method and Method of Manufacturing Semiconductor Substrate]

The polishing composition is suitably used for polishing an object to be polished containing SiOC and SiN. Therefore, according to another aspect of the present invention, there is provided a polishing method including a step of polishing an object to be polished containing SiOC and SiN using the polishing composition. In addition, according to still another aspect of the present invention, there is provided a method of manufacturing a semiconductor substrate, the method including a step of polishing a semiconductor substrate containing SiOC and SiN by the polishing method.

As a polishing apparatus, it is possible to use a general polishing apparatus equipped with a holder for holding a substrate or the like including an object to be polished, a motor capable of changing a rotation speed, and the like, and having a polishing table to which a polishing pad (polishing cloth) can be attached.

As the polishing pad, a general nonwoven fabric, polyurethane, a porous fluororesin, or the like can be used without particular limitation. It is preferable that the polishing pad is subjected to groove processing so that a polishing solution is pooled therein.

As for the polishing conditions, for example, the rotation speeds of the polishing table and the carrier are preferably 10 rpm (0.17 s-1) or more and 500 rpm (8.33 s-1) or less. The pressure (polishing pressure) applied to the substrate including the object to be polished is preferably 0.5 psi (3.4 kPa) or more and 10 psi (68.9 kPa) or less.

A method of supplying the polishing composition to the polishing pad is also not particularly limited, and for example, a method of continuously supplying with a pump or the like is adopted. The supply amount is not particularly limited, and it is preferable that a surface of the polishing pad is always covered with the polishing composition according to the present invention.

After completion of the polishing, the substrate is washed in flowing water, and water droplets attached to the substrate are removed and dried by a spin dryer or the like, so that a substrate having a layer containing SiOC and SiN is obtained.

Although embodiments of the present invention have been described in detail, they are illustrative and exemplary but not restrictive. It is clear that the scope of the present invention should be interpreted by the appended claims.

The present invention includes the following aspects and embodiments.

1. A polishing composition containing:
   abrasive grains containing at least one kind of zirconia particles;
   a selection ratio improver containing at least one kind of a salt composed of a monovalent anion and a monovalent or higher valent cation and improving a ratio of a polishing speed of SiOC to a polishing speed of SiN; and
   a pH adjusting agent containing at least one kind of an acid,
   in which a pH is more than 3.0 and less than 7.0, and
   a zeta potential of the abrasive grain is a positive value.

2. The polishing composition according to 1. above, in which a concentration of the selection ratio improver is 50 ppm or more and 1,000 ppm or less.

3. The polishing composition according to 1. above or 2. above, in which the pH is 4.0 or more and 6.0 or less.

4. The polishing composition according to any one of 1. above to 3. above, in which the pH adjusting agent contains acetic acid.

5. The polishing composition according to any one of 1. above to 4. above, in which the selection ratio improver contains ammonium acetate.

6. The polishing composition according to any one of 1. above to 5. above, in which a content of the abrasive grains is 0.01% by mass or more and 1.0% by mass or less.

7. The polishing composition according to any one of 1. above to 6. above, further containing at least one kind of a dispersant selected from the group consisting of sugar alcohols.

8. A polishing method including a step of polishing an object to be polished containing SiOC and SiN using the polishing composition according to any one of 1. above to 7. above.

9. A method of manufacturing a semiconductor substrate, the method including a step of polishing a semiconductor substrate containing SiOC and SiN by the polishing method according to 8. above.

EXAMPLES

The present invention will be described in more detail with reference to the following Examples and Comparative Examples. However, the technical scope of the present invention is not limited to only the following Examples. Unless otherwise specified, "%" and "part(s)" refer to "% by mass" and "part(s) by mass", respectively.

[Measurement Methods of Various Physical Properties]

In the present Examples, various physical properties were measured by the following methods.

<Measurement of Particle Size (D50)>

As a value of D50 of the zirconia particles, a value measured as a volume average particle size by a dynamic light scattering method using a particle size distribution measurement apparatus (Nanotrac UPA-UT151, manufactured by MicrotracBEL Corp.) was adopted. More specifically, a particle size of the zirconia particle was measured using a dispersion liquid in which the zirconia particles were dispersed in water. A diameter (D50) of the particle when an integrated particle volume reached 50% of a total particle volume from the fine particle side in a particle size distribution of the particle size of the zirconia particles was calculated by analysis with a measuring instrument.

<Measurement of Zeta Potential>

A zeta potential of the zirconia particle was measured using a zeta potential measurement apparatus (trade name "Zetasizer Nano ZSP") manufactured by Malvern Panalytical Ltd.

<Measurement of pH>

A pH of the polishing composition was measured by a pH meter (model number: F-71, manufactured by Horiba, Ltd.).

[Preparation of Polishing Composition]

Example 1

Colloidal zirconia (ZSL-20N (ZrO2 sol, D50: 70 nm) manufactured by DAIICHI KIGENSO KAGAKU-KOGYO CO., LTD.) as abrasive grains and ammonium acetate as a selection ratio improver were added to pure water as a dispersing medium at room temperature (25° C.) so that a final concentration of the colloidal zirconia was 0.10% by mass and a final concentration of the ammonium acetate was 50 ppm. Further, 1,2-benzisothiazol-3(2H)-one (BIT, manufactured by San-Ai Oil Co., Ltd.) as an antifungal agent was added so that a final concentration was 0.3 g/kg (0.03% by mass) to obtain a mixed solution. Acetic acid as a pH adjusting agent was added to the obtained mixed solution so that a pH was 5.0, and the mixture was stirred and mixed at room temperature (25° C.) for 30 minutes, thereby preparing a polishing composition. A zeta potential of the colloidal zirconia in the obtained polishing composition was +35 mV. In addition, a particle size of the colloidal zirconia in the polishing composition was the same as the particle size of the colloidal zirconia described above.

Example 2

A polishing composition was prepared in the same manner as that of Example 1, except that ammonium acetate was added to pure water so that a final concentration was 100 ppm. A zeta potential of the colloidal zirconia in the obtained polishing composition was +35 mV.

Example 3

A polishing composition was prepared in the same manner as that of Example 1, except that ammonium acetate was added to pure water so that a final concentration was 200 ppm. A zeta potential of the colloidal zirconia in the obtained polishing composition was +35 mV.

Example 4

A polishing composition was prepared in the same manner as that of Example 1, except that ammonium acetate was added to pure water so that a final concentration was 500 ppm. A zeta potential of the colloidal zirconia in the obtained polishing composition was +35 mV.

Example 5

A polishing composition was prepared in the same manner as that of Example 1, except that ammonium acetate was added to pure water so that a final concentration was 1,000 ppm. A zeta potential of the colloidal zirconia in the obtained polishing composition was +35 mV.

Example 6

A polishing composition was prepared in the same manner as that of Example 4, except that acetic acid was added to a mixed solution so that a pH was 4.0. A zeta potential of the colloidal zirconia in the obtained polishing composition was +37 mV.

Example 7

A polishing composition was prepared in the same manner as that of Example 4, except that acetic acid was added to a mixed solution so that a pH was 4.5. A zeta potential of the colloidal zirconia in the obtained polishing composition was +35 mV.

Example 8

A polishing composition was prepared in the same manner as that of Example 4, except that acetic acid was added to a mixed solution so that a pH was 6.0. A zeta potential of the colloidal zirconia in the obtained polishing composition was +30 mV.

Example 9

A polishing composition was prepared in the same manner as that of Example 4, except that ammonium nitrate was used as a selection ratio improver instead of ammonium acetate and nitric acid was used as a pH adjusting agent instead of acetic acid. A zeta potential of the colloidal zirconia in the obtained polishing composition was +36 mV.

Example 10

A polishing composition was prepared in the same manner as that of Example 4, except that nitric acid was used as a pH adjusting agent instead of acetic acid. A zeta potential of the colloidal zirconia in the obtained polishing composition was +35 mV.

Example 11

A polishing composition was prepared in the same manner as that of Example 4, except that potassium acetate was used as a selection ratio improver instead of ammonium acetate. A zeta potential of the colloidal zirconia in the obtained polishing composition was +36 mV.

Example 12

Colloidal zirconia (ZSL-20N (ZrO2 sol, D50: 70 nm) manufactured by DAIICHI KIGENSO KAGAKU-KOGYO CO., LTD.) as abrasive grains, ammonium acetate as a selection ratio improver, and sorbitol as a dispersant were added to pure water as a dispersing medium at room temperature (25° C.) so that a final concentration of the colloidal zirconia was 0.10% by mass, a final concentration of the ammonium acetate was 500 ppm, and a final concentration of the sorbitol was 10 ppm. Further, 1,2-benzisothiazol-3(2H)-one (BIT, manufactured by San-Ai Oil Co., Ltd.) as an antifungal agent was added so that a final concentration was 0.3 g/kg (0.03% by mass) to obtain a mixed solution. Acetic acid as a pH adjusting agent was added to the obtained mixed solution so that a pH was 5.0, and the mixture was stirred and mixed at room temperature (25° C.) for 30 minutes, thereby preparing a polishing composition. A zeta potential of the colloidal zirconia in the obtained polishing composition was +35 mV. In addition, a particle size of the colloidal zirconia in the polishing composition was the same as the particle size of the colloidal zirconia described above.

Example 13

A polishing composition was prepared in the same manner as that of Example 12, except that sorbitol was added to pure water so that a final concentration was 50 ppm. A zeta potential of the colloidal zirconia in the obtained polishing composition was +35 mV.

Example 14

A polishing composition was prepared in the same manner as that of Example 12, except that sorbitol was added to pure water so that a final concentration was 80 ppm. A zeta potential of the colloidal zirconia in the obtained polishing composition was +35 mV.

Example 15

A polishing composition was prepared in the same manner as that of Example 12, except that sorbitol was added to pure water so that a final concentration was 100 ppm. A zeta potential of the colloidal zirconia in the obtained polishing composition was +35 mV.

Example 16

A polishing composition was prepared in the same manner as that of Example 12, except that sorbitol was added to pure water so that a final concentration was 200 ppm. A zeta potential of the colloidal zirconia in the obtained polishing composition was +35 mV.

Example 17

A polishing composition was prepared in the same manner as that of Example 12, except that sorbitol was added to pure water so that a final concentration was 500 ppm. A zeta potential of the colloidal zirconia in the obtained polishing composition was +35 mV.

Example 18

A polishing composition was prepared in the same manner as that of Example 15, except that xylitol was used as a dispersant instead of sorbitol. A zeta potential of the colloidal zirconia in the obtained polishing composition was +35 mV.

Comparative Example 1

A polishing composition was prepared in the same manner as that of Example 1, except that a selection ratio improver was not added, and nitric acid was used as a pH adjusting agent instead of acetic acid. A zeta potential of the colloidal zirconia in the obtained polishing composition was +34 mV.

Comparative Example 2

A polishing composition was prepared in the same manner as that of Example 1, except that a selection ratio improver was not added. A zeta potential of the colloidal zirconia in the obtained polishing composition was +36 mV.

Comparative Example 3

A polishing composition was prepared in the same manner as that of Example 4, except that ammonium oxalate monohydrate was used instead of ammonium acetate. A zeta potential of the colloidal zirconia in the obtained polishing composition was −32 mV.

Comparative Example 4

A polishing composition was prepared in the same manner as that of Example 4, except that triammonium citrate was used instead of ammonium acetate. A zeta potential of the colloidal zirconia in the obtained polishing composition was −39 mV.

Comparative Example 5

A polishing composition was prepared in the same manner as that of Example 4, except that acetic acid was added to a mixed solution so that a pH was 3.0. A zeta potential of the colloidal zirconia in the obtained polishing composition was +39 mV.

Comparative Example 6

A polishing composition was prepared in the same manner as that of Example 4, except that acetic acid was added to a mixed solution so that a pH was 7.0. A zeta potential of the colloidal zirconia in the obtained polishing composition could not be measured because the colloidal zirconia was aggregated.

Comparative Example 7

A polishing composition was prepared in the same manner as that of Example 4, except that acetic acid was added to a mixed solution so that a pH was 8.0. A zeta potential of the colloidal zirconia in the obtained polishing composition could not be measured because the colloidal zirconia was aggregated.

Comparative Example 8

A polishing composition was prepared in the same manner as that of Example 4, except that colloidal zirconia (ZSL00014 (ZrO2 sol), D50: 15 nm, manufactured by DAIICHI KIGENSO KAGAKU-KOGYO CO., LTD.) as abrasive grains was added to pure water instead of colloidal zirconia (ZSL-20N) so that a final concentration was 1.0% by mass. A zeta potential of the colloidal zirconia in the obtained polishing composition was −23 mV.

Comparative Example 9

A polishing composition was prepared in the same manner as that of Comparative Example 1, except that colloidal silica (D50: 70 nm) having a surface on which an amino group was immobilized was used as abrasive grains instead of colloidal zirconia (ZSL-20N). A zeta potential of the colloidal silica in the obtained polishing composition was +24 mV.

Comparative Example 10

A polishing composition was prepared in the same manner as that of Comparative Example 1, except that colloidal ceria (D50: 70 nm) was used as abrasive grains instead of colloidal zirconia (ZSL-20N). A zeta potential of the colloidal ceria in the obtained polishing composition was +33 mV.

Comparative Example 11

A polishing composition was prepared in the same manner as that of Comparative Example 1, except that colloidal alumina (D50: 300 nm) was used as abrasive grains instead of colloidal zirconia (ZSL-20N). A zeta potential of the colloidal alumina in the obtained polishing composition was +29 mV.

[Polishing Speed]

A 300 mm wafer (SiOC film, trade name: BD2x 5 kA Blanket, manufactured by Advanced Materials Technology Inc.) and a 300 mm wafer (SiN (silicon nitride) film, trade name: LP-SiN 3.5 KA Blanket, manufactured by Advanced Materials Technology Inc.) were prepared as objects to be polished (substrates).

Using the obtained polishing composition, each of the prepared substrates was polished under the following conditions, and a polishing speed was measured.

(Polishing Conditions)
Polishing apparatus: EJ-380IN-CH (manufactured by ENGIS JAPAN Corporation)
Polishing pad: hard polyurethane pad (IC1010, manufactured by NITTA DuPont Incorporated)
Polishing pressure: 3.0 psi (1 psi=6,894.76 Pa)
Platen (table) rotation speed: 60 rpm
Head (carrier) rotation speed: 60 rpm
Flow rate of polishing composition: 100 mL/min
Polishing time: 30 seconds (Polishing Speed)

A film thickness was determined by a light interference type film thickness measurement apparatus (model number: Lambda Ace VM-2030, manufactured by SCREEN Holdings), and a polishing speed was evaluated by dividing a difference in film thickness before and after polishing by a polishing time (see the following equation). A polishing speed of SiOC is preferably 1,700 Å/min or more, and a polishing speed of SiN is preferably less than 30 Å/min.

$$\text{Polishing speed (Å/min)} = \frac{\begin{array}{c}\text{[Film thickness (Å) of object to be}\\ \text{polished before polishing]} -\\ \text{[Film thickness (Å) of object to be}\\ \text{polished after polishing]}\end{array}}{\text{[Polishing time (min)]}} \quad \text{[Math. 1]}$$

(Selection Ratio)

A selection ratio was determined by dividing the polishing speed of the obtained SiOC substrate by the polishing speed of the SiN substrate. The selection ratio is preferably 100 or more.

[Storage Stability]

An average secondary particle size (D50) of the abrasive grains in each of the polishing compositions was measured at room temperature (25° C.) by a dynamic light scattering method using a particle size distribution measurement apparatus (Nanotrac UPA-UT151, manufactured by Microtrac-BEL Corp.). Specifically, a diameter D50 (nm) of the particle when an integrated particle volume reached 50% of a total particle volume from the fine particle side in a particle size distribution of the particle size of the abrasive grains was calculated, and the diameter D50 (nm) was used as an average secondary particle size (D50A) (nm) of the abrasive grains.

Separately, 100 g of each of the polishing compositions was weighed in a poly bottle. Next, each poly bottle was placed in a thermostatic bath set at 80° C. and left for 2 weeks. After being left for a predetermined period of time, an average secondary particle size (D50B) (nm) of the abrasive grains in each of the polishing compositions was measured as described above.

Based on the average secondary particle sizes of the abrasive grains before and after being left (the average secondary particle size (D50A (nm)) of the abrasive grains before being left and the average secondary particle size (D50B (nm)) of the abrasive grains after being left), an increase rate (%) of the average secondary particle size was calculated according to the following equation and used as an index of storage stability. The smaller the absolute value of the storage stability (the increase rate of the average secondary particle size) (%), the better the storage stability. The absolute value of the storage stability (the increase rate of the average secondary particle size) (%) is 40% or less, which is acceptable, preferably 35% or less, more preferably 25% or less, still more preferably less than 10%, and particularly preferably less than 5%.

$$\text{Storage stability (\%)} = \frac{D50_B(\text{nm}) - D50_A(\text{nm})}{D50_A(\text{nm})} \times 100 \quad \text{[Math. 2]}$$

The evaluation results of the polishing composition of each of Examples and each of Comparative Examples are shown in Table 1. Note that "-" in Table 1 indicates that the agent is not used.

TABLE 1

| | Abrasive grains | | | pH adjusting agent Compound | Selection ratio improver | | Dispersant Compound |
| | Compound | Concentration [wt %] | Particle size [nm] | | Compound | Concentration [ppm] | |
|---|---|---|---|---|---|---|---|
| Example 1 | Colloidal zirconia | 0.10 | 70 | $CH_3COOH$ | $CH_3COONH_4$ | 50 | — |
| Example 2 | Colloidal zirconia | 0.10 | 70 | $CH_3COOH$ | $CH_3COONH_4$ | 100 | — |
| Example 3 | Colloidal zirconia | 0.10 | 70 | $CH_3COOH$ | $CH_3COONH_4$ | 200 | — |
| Example 4 | Colloidal zirconia | 0.10 | 70 | $CH_3COOH$ | $CH_3COONH_4$ | 500 | — |
| Example 5 | Colloidal zirconia | 0.10 | 70 | $CH_3COOH$ | $CH_3COONH_4$ | 1000 | — |

TABLE 1-continued

| | | | | | | | |
|---|---|---|---|---|---|---|---|
| Example 6 | Colloidal zirconia | 0.10 | 70 | CH₃COOH | CH₃COONH₄ | 500 | — |
| Example 7 | Colloidal zirconia | 0.10 | 70 | CH₃COOH | CH₃COONH₄ | 500 | — |
| Example 8 | Colloidal zirconia | 0.10 | 70 | CH₃COOH | CH₃COONH₄ | 500 | — |
| Example 9 | Colloidal zirconia | 0.10 | 70 | HNO₃ | NO₃NH₄ | 500 | — |
| Example 10 | Colloidal zirconia | 0.10 | 70 | HNO₃ | CH₃COONH₄ | 500 | — |
| Example 11 | Colloidal zirconia | 0.10 | 70 | CH₃COOH | CH₃COOK | 500 | — |
| Example 12 | Colloidal zirconia | 0.10 | 70 | CH₃COOH | CH₃COONH₄ | 500 | Sorbitol |
| Example 13 | Colloidal zirconia | 0.10 | 70 | CH₃COOH | CH₃COONH₄ | 500 | Sorbitol |
| Example 14 | Colloidal zirconia | 0.10 | 70 | CH₃COOH | CH₃COONH₄ | 500 | Sorbitol |
| Example 15 | Colloidal zirconia | 0.10 | 70 | CH₃COOH | CH₃COONH₄ | 500 | Sorbitol |
| Example 16 | Colloidal zirconia | 0.10 | 70 | CH₃COOH | CH₃COONH₄ | 500 | Sorbitol |
| Example 17 | Colloidal zirconia | 0.10 | 70 | CH₃COOH | CH₃COONH₄ | 500 | Sorbitol |
| Example 18 | Colloidal zirconia | 0.10 | 70 | CH₃COOH | CH₃COONH₄ | 500 | Xylitol |
| Comparative Example 1 | Colloidal zirconia | 0.10 | 70 | HNO₃ | — | 0 | — |
| Comparative Example 2 | Colloidal zirconia | 0.10 | 70 | CH₃COOH | — | 0 | — |
| Comparative Example 3 | Colloidal zirconia | 0.10 | 70 | CH₃COOH | Ammonium oxalate monohydrate | 500 | — |
| Comparative Example 4 | Colloidal zirconia | 0.10 | 70 | CH₃COOH | Triammonium citrate | 500 | — |
| Comparative Example 5 | Colloidal zirconia | 0.10 | 70 | CH₃COOH | CH₃COONH₄ | 500 | — |
| Comparative Example 6 | Colloidal zirconia | 0.10 | 70 | CH₃COOH | CH₃COONH₄ | 500 | — |
| Comparative Example 7 | Colloidal zirconia | 0.10 | 70 | CH₃COOH | CH₃COONH₄ | 500 | — |
| Comparative Example 8 | Colloidal zirconia | 1.0 | 15 | CH₃COOH | CH₃COONH₄ | 500 | — |
| Comparative Example 9 | Colloidal silica | 0.10 | 70 | HNO₃ | — | 0 | — |
| Comparative Example 10 | Colloidal ceria | 0.10 | 70 | HNO₃ | — | 0 | — |
| Comparative Example 11 | Colloidal alumina | 0.10 | 300 | HNO₃ | — | 0 | — |

| | Dispersant Concentration [ppm] | pH | Physical properties Zeta potential [mV] | Polishing speed $S_iOC$ [Å/min] | $S_iN$ [Å/min] | Selection ratio $S_iOC/S_iN$ | Storage stability |
|---|---|---|---|---|---|---|---|
| Example 1 | 0 | 5.0 | +35 | 2586 | 17 | 152 | +1% |
| Example 2 | 0 | 5.0 | +35 | 2880 | 15 | 192 | +3% |
| Example 3 | 0 | 5.0 | +35 | 3076 | 16 | 192 | +19% |
| Example 4 | 0 | 5.0 | +35 | 3521 | 17 | 207 | +34% |
| Example 5 | 0 | 5.0 | +35 | 3217 | 20 | 161 | +43% |
| Example 6 | 0 | 4.0 | +37 | 1898 | 12 | 158 | +31% |
| Example 7 | 0 | 4.5 | +35 | 2803 | 16 | 175 | +35% |
| Example 8 | 0 | 6.0 | +30 | 4160 | 25 | 166 | +45% |
| Example 9 | 0 | 5.0 | +36 | 1794 | 17 | 106 | +20% |
| Example 10 | 0 | 5.0 | +35 | 3086 | 19 | 162 | +27% |
| Example 11 | 0 | 5.0 | +36 | 2088 | 16 | 131 | +31% |
| Example 12 | 10 | 5.0 | +35 | 3518 | 18 | 195 | +31% |
| Example 13 | 50 | 5.0 | +35 | 3523 | 16 | 220 | +16% |
| Example 14 | 80 | 5.0 | +35 | 3526 | 15 | 235 | +2% |
| Example 15 | 100 | 5.0 | +35 | 3527 | 14 | 252 | +0% |
| Example 16 | 200 | 5.0 | +35 | 3524 | 15 | 235 | +0% |
| Example 17 | 500 | 5.0 | +35 | 3522 | 18 | 196 | +0% |
| Example 18 | 100 | 5.0 | +35 | 3517 | 18 | 195 | +3% |
| Comparative Example 1 | 0 | 5.0 | +34 | 1160 | 30 | 39 | +0% |
| Comparative Example 2 | 0 | 5.0 | +36 | 1654 | 34 | 49 | +0% |

TABLE 1-continued

| | | | | | | | |
|---|---|---|---|---|---|---|---|
| Comparative Example 3 | 0 | 5.0 | −32 | 31 | 17 | 1.8 | Aggregation |
| Comparative Example 4 | 0 | 5.0 | −39 | 10 | 18 | 0.6 | Aggregation |
| Comparative Example 5 | 0 | 3.0 | +39 | 392 | 31 | 13 | +28% |
| Comparative Example 6 | 0 | 7.0 | Aggregation | Not measurable | Not measurable | Not measurable | Aggregation |
| Comparative Example 7 | 0 | 8.0 | Aggregation | Not measurable | Not measurable | Not measurable | Aggregation |
| Comparative Example 8 | 0 | 5.0 | −23 | 580 | 30 | 20 | +36% |
| Comparative Example 9 | 0 | 5.0 | +24 | 19 | 44 | 0.4 | +0% |
| Comparative Example 10 | 0 | 5.0 | +33 | 590 | 38 | 16 | +2% |
| Comparative Example 11 | 0 | 5.0 | +29 | 35 | 74 | 0.5 | +6% |

As shown in Table 1, it is found that the polishing composition of each of Examples can suppress the polishing speed of SiN to be low while polishing SiOC at a high polishing speed, and thus can improve the ratio (selection ratio) of the polishing speed of SiOC to the polishing speed of SiN.

What is claimed is:

1. A polishing composition comprising:
   abrasive grains containing at least one kind of zirconia particles;
   a selection ratio improver containing at least one kind of a salt composed of a monovalent anion and a monovalent or higher valent cation and improving a ratio of a polishing speed of SiOC to a polishing speed of SiN; and
   a pH adjusting agent containing at least one kind of an acid,
   wherein a pH is more than 3.0 and less than 7.0, and
   a zeta potential of the abrasive grain is a positive value.

2. The polishing composition according to claim 1, wherein a concentration of the selection ratio improver is 50 ppm or more and 1,000 ppm or less.

3. The polishing composition according to claim 1, wherein the pH is 4.0 or more and 6.0 or less.

4. The polishing composition according to claim 1, wherein the pH adjusting agent contains acetic acid.

5. The polishing composition according to claim 1, wherein the selection ratio improver contains ammonium acetate.

6. The polishing composition according to claim 1, wherein a content of the abrasive grains is 0.01% by mass or more and 1.0% by mass or less.

7. The polishing composition according to claim 1, further comprising at least one kind of a dispersant selected from the group consisting of sugar alcohols.

8. A polishing method comprising a step of polishing an object to be polished containing SiOC and SiN using the polishing composition according to claim 1.

9. A method of manufacturing a semiconductor substrate, the method comprising a step of polishing a semiconductor substrate containing SiOC and SiN by the polishing method according to claim 8.

* * * * *